United States Patent
McNeil, Jr. et al.

(10) Patent No.: US 11,437,111 B2
(45) Date of Patent: Sep. 6, 2022

(54) TRIMS CORRESPONDING TO PROGRAM/ERASE CYCLES

(71) Applicant: Micron Technology, Inc., Boise, ID (US)

(72) Inventors: Jeffrey S. McNeil, Jr., Nampa, ID (US); Karl D. Schuh, Santa Cruz, CA (US); Vamsi Pavan Rayaprolu, San Jose, CA (US); Giuseppina Puzzilli, Boise, ID (US); Kishore K. Muchherla, Fremont, CA (US); Gil Golov, Backnang (DE); Todd A. Marquart, Boise, ID (US); Jiangang Wu, Milpitas, CA (US); Niccolo' Righetti, Bosie, ID (US); Ashutosh Malshe, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/122,758

(22) Filed: Dec. 15, 2020

(65) Prior Publication Data
US 2022/0189571 A1  Jun. 16, 2022

(51) Int. Cl.
G11C 16/34 (2006.01)
G11C 16/16 (2006.01)
G11C 16/30 (2006.01)
G11C 16/32 (2006.01)
G11C 16/26 (2006.01)

(52) U.S. Cl.
CPC .......... G11C 16/3495 (2013.01); G11C 16/16 (2013.01); G11C 16/26 (2013.01); G11C 16/30 (2013.01); G11C 16/32 (2013.01)

(58) Field of Classification Search
CPC ..... G11C 16/3495; G11C 16/16; G11C 16/26; G11C 16/30; G11C 16/32
See application file for complete search history.

(56) References Cited

U.S. PATENT DOCUMENTS

| 8,630,137 B1 * | 1/2014 | He ................... G11C 29/00 365/201 |
| 9,857,992 B2 | 1/2018 | Pangal et al. |
| 9,857,995 B1 | 1/2018 | Malina et al. |
| 2016/0188231 A1 * | 6/2016 | Mittelholzer ....... G06F 11/1012 714/704 |

* cited by examiner

Primary Examiner — Jay W. Radke
(74) Attorney, Agent, or Firm — Brooks, Cameron & Huebsch, PLLC (57) ABSTRACT

Instructions can be executed to adjust a trim at first intervals until a quantity of program/erase cycles (PEC) have occurred. The trim defines a valley width between data states. Instructions can be executed to adjust the trim at second intervals, greater than the first intervals, after the quantity of PEC have occurred.

20 Claims, 7 Drawing Sheets

RECEIVING A RESPECTIVE INDICATION FOR EACH COMPLETION OF A FIRST INTERVAL OF PROGRAM/ERASE CYCLES (PEC) — 542

ADJUSTING A TRIM DEFINING A VALLEY WIDTH BETWEEN DATA STATES BY A FIRST MAGNITUDE IN RESPONSE TO THE RESPECTIVE INDICATION OF THE FIRST INTERVAL — 544

SUBSEQUENTLY RECEIVING A RESPECTIVE INDICATION FOR EACH COMPLETION OF A SECOND INTERVAL OF PEC, WHEREIN THE SECOND INTERVAL INCLUDES MORE PEC THAN THE FIRST INTERVAL — 546

ADJUSTING THE TRIM BY A SECOND MAGNITUDE, GREATER THAN THE FIRST MAGNITUDE, IN RESPONSE TO THE RESPECTIVE INDICATION OF THE SECOND INTERVAL — 548

TRIMS CORRESPONDING TO PROGRAM/ERASE CYCLES

TECHNICAL FIELD

Embodiments of the disclosure relate generally to memory systems and more specifically relate to trims corresponding to program/erase cycles.

BACKGROUND

A memory system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

A memory sub-system can be a storage device, a memory module, or a hybrid of a storage device and memory module. Examples of storage devices and memory modules are described below in conjunction with FIG. 1. In general, a host system can utilize a memory sub-system that includes one or more memory devices, such as memory devices that store data. The host system can provide data to be stored at the memory sub-system and can request data to be retrieved from the memory sub-system.

Aspects of the present disclosure are directed to trims of a memory device corresponding to program/erase cycles (PEC). Adjusting trims based on PEC involves a tradeoff between firmware overhead necessary for calibrating the trims and the granularity with which the trims are adjusted based on PEC. For example, a larger number of PEC groups used for trim adjustment requires a larger firmware overhead. However, the return on investment for using a static PEC increment (e.g., normalized to a particular trim of an operating valley width) increases logarithmically with PEC. Accordingly, at least one embodiment of the present disclosure can adjust trims at a finer interval during an early portion of life of a memory device (e.g., when the operating valley width is narrower) and adjust trims at a coarser interval later in the life of the memory device (e.g., when the operating valley width is wider). The return on investment of adjusting the trims at shorter intervals has diminishing returns as the memory device ages.

The figures herein follow a numbering convention in which the first digit or digits correspond to the drawing figure number and the remaining digits identify an element or component in the drawing. Similar elements or components between different figures can be identified by the use of similar digits. For example, 102 can reference element "02" in FIG. 1, and a similar element can be referenced as 602 in FIG. 6. Analogous elements within a Figure may be referenced with a hyphen and extra numeral or letter. Such analogous elements may be generally referenced without the hyphen and extra numeral or letter. For example, elements 762-1, 762-2, and 762-B in FIG. 7 may be collectively referenced as 762. As used herein, the designators "B", "N", "P", and "5", particularly with respect to reference numerals in the drawings, indicates that a number of the particular feature so designated can be included. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

Figure 1:
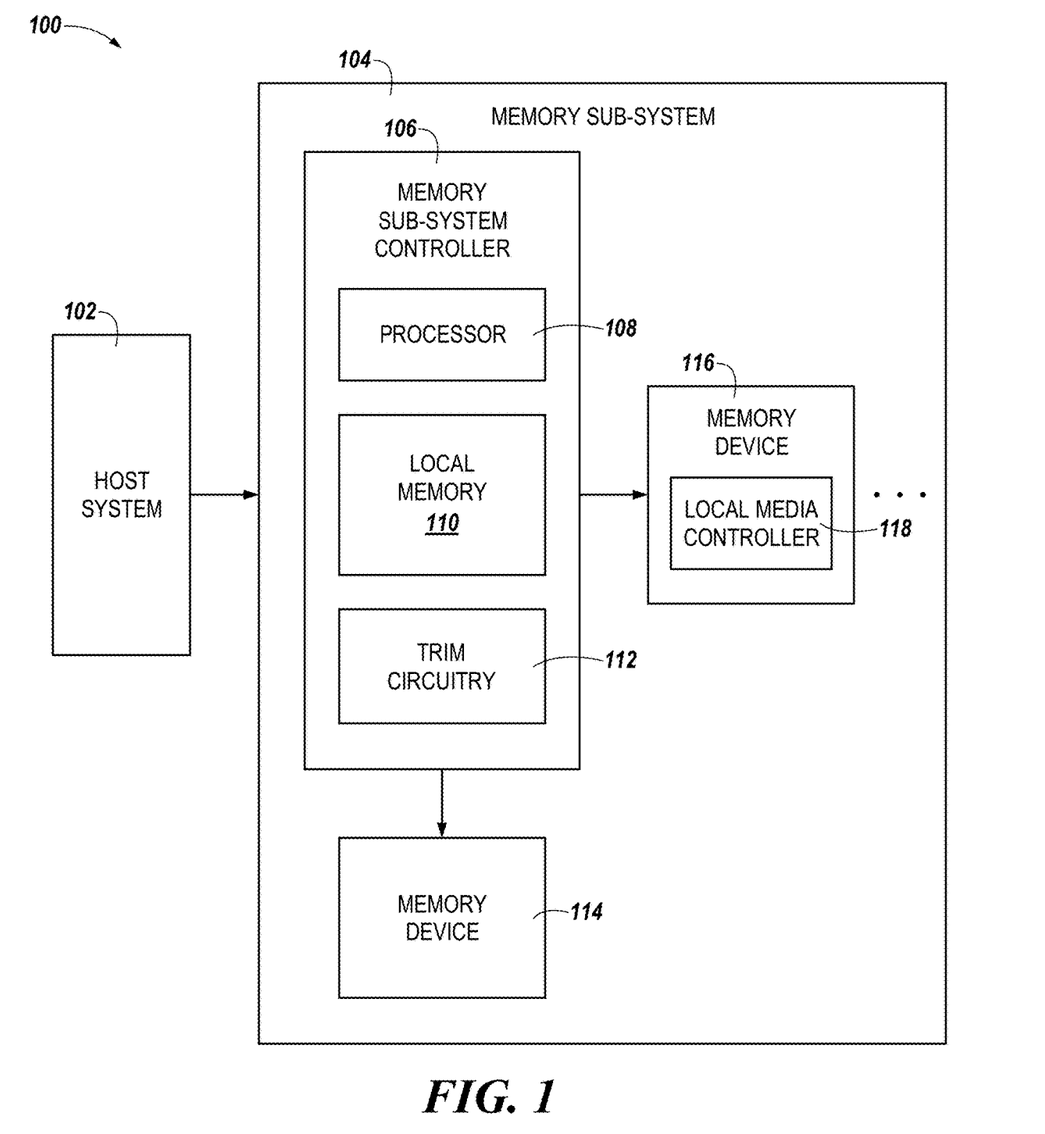
FIG. 1 illustrates an example computing system that includes a memory sub-system in accordance with some embodiments of the present disclosure.

FIG. 1 illustrates an example computing system 100 that includes a memory sub-system 104 in accordance with some embodiments of the present disclosure. The memory sub-system 104 can include media, such as one or more volatile memory devices 114, one or more non-volatile memory devices 116, or a combination thereof. The volatile memory device 114 can be, but is not limited to, random access memory (RAM), such as dynamic random access memory (DRAM), synchronous dynamic random access memory (SDRAM), and resistive DRAM (RDRAM).

A memory sub-system 104 can be a storage device, a memory module, or a hybrid of a storage device and memory module. Examples of a storage device include a solid state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a desktop computer, laptop computer, network server, mobile device, a vehicle (e.g., airplane, drone, train, automobile, or other conveyance), IoT enabled device, embedded computer (e.g., one included in a vehicle, industrial equipment, or a networked commercial device), or similar computing system that includes memory and a processing device.

The computing system 100 includes a host system 102 that is coupled to one or more memory sub-systems 104. In some embodiments, the host system 102 is coupled to different types of memory sub-systems 104. FIG. 1 illustrates an example of a host system 102 coupled to one memory sub-system 104. In at least one embodiment, the host system 102 is a computing device that controls a vehicle, such as an autonomous vehicle, and the memory sub-system 104 is an SSD that provides black box storage for the vehicle. For example, the memory sub-system 104 can store time based telemetric sensor data for the vehicle. Embodiments are not limited to this example. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 102 can include a processor chipset and a software stack executed by the processor chipset. The processor chipset can include one or more cores, one or more caches, a memory controller (e.g., NVDIMM controller), and a storage protocol controller (e.g., PCIe controller, SATA controller, etc.). The host system 102 uses the memory sub-system 104, for example, to write data to the memory sub-system 104 and read data from the memory sub-system 104.

The host system 102 can be coupled to the memory sub-system 104 via a physical host interface. Examples of a physical host interface include, but are not limited to, a serial advanced technology attachment (SATA) interface, a PCIe interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 102 and the memory sub-system 104. The host system 102 can further utilize an NVM Express (NVMe) interface to access the non-volatile memory device 116 when the memory sub-system 104 is coupled with the host system 102 by the PCIe interface. The physical host interface can provide an interface for passing control, address, data, and other signals between the memory sub-system 104 and the host system 102. FIG. 1 illustrates a memory sub-system 104 as an example. In general, the host system 102 can access multiple memory sub-systems via a same communication connection, multiple separate communication connections, and/or a combination of communication connections.

The host system 102 can send requests to the memory sub-system 104, for example, to store data in the memory sub-system 104 or to read data from the memory sub-system 104. The data to be written or read, as specified by a host request, is referred to as "host data." A host request can include logical address information. The logical address information can be a logical block address (LBA), which can include or be accompanied by a partition number. The logical address information is the location the host system associates with the host data. The logical address information can be part of metadata for the host data. The LBA can also correspond (e.g., dynamically map) to a physical address, such as a physical block address (PBA), that indicates the physical location where the host data is stored in memory.

An example of non-volatile memory devices 116 include not-and (NAND) type flash memory. NAND type flash memory includes, for example, two-dimensional NAND (2D NAND) and three-dimensional NAND (3D NAND). The non-volatile memory device 116 can be another types of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM), and three-dimensional cross-point memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Each of the non-volatile memory device 116 can include one or more arrays of memory cells. One method of operating a memory cell includes storing one-bit per cell, which is referred to as a single level cell (SLC). The "level" refers to the quantity of states to which the cell is programed, other than an erased state (level). An SLC can be programmed to one level other than the erased level. Other methods of operating memory cells include storing more than one bit per cell, such as multi-level cells (MLCs), triple level cells (TLCs), quad-level cells (QLCs), and penta-level cells (PLCs), among others. As used herein, "multi-level cells (MLCs)" refers to a memory cell that is programmable to two levels other than an erased level. In some embodiments, the non-volatile memory device 116 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the non-volatile memory device 116 can be grouped as pages that can refer to a logical portion of the memory device used to store data. With some types of memory (e.g., NAND), pages can be grouped to form blocks.

The memory sub-system controller 106 (or controller 106 for simplicity) can communicate with the non-volatile memory device 116 to perform operations such as reading data, writing data, erasing data, and other such operations at the non-volatile memory device 116. The memory sub-system controller 106 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 106 can be a microcontroller, special purpose logic circuitry (e.g., a field programmable gate array (FPGA), an application specific integrated circuit (ASIC), etc.), or other suitable circuitry.

The memory sub-system controller 106 can include a processing device 108 (e.g., a processor) configured to execute instructions stored in local memory 110. In the illustrated example, the local memory 110 of the memory sub-system controller 106 is an embedded memory configured to store instructions for performing various processes, operations, logic flows, and routines that control operation of the memory sub-system 104, including handling communications between the memory sub-system 104 and the host system 102.

In some embodiments, the local memory 110 can include memory registers storing memory pointers, fetched data, etc.

The local memory 110 can also include ROM for storing micro-code, for example. While the example memory sub-system 104 in FIG. 1 has been illustrated as including the memory sub-system controller 106, in another embodiment of the present disclosure, a memory sub-system 104 does not include a memory sub-system controller 106, and can instead rely upon external control (e.g., provided by an external host, or by a processor or controller separate from the memory sub-system 104).

In general, the memory sub-system controller 106 can receive information or operations from the host system 102 and can convert the information or operations into instructions or appropriate information to achieve the desired access to the non-volatile memory device 116 and/or the volatile memory device 114. The memory sub-system controller 106 can be responsible for other operations such as wear leveling operations, error detection and/or correction operations, encryption operations, caching operations, and address translations between a logical address (e.g., logical block address) and a physical address (e.g., physical block address) associated with the non-volatile memory device 116. The memory sub-system controller 106 can further include host interface circuitry to communicate with the host system 102 via the physical host interface. The host interface circuitry can convert a query received from the host system 102 into a command to access the non-volatile memory device 116 and/or the volatile memory device 114 as well as convert responses associated with the non-volatile memory device 116 and/or the volatile memory device 114 into information for the host system 102.

In some embodiments, the non-volatile memory device 116 includes a local media controller 118 that operates in conjunction with memory sub-system controller 106 to execute operations on one or more memory cells of the non-volatile memory device 116. An external controller (e.g., memory sub-system controller 106) can externally manage the non-volatile memory device 116 (e.g., perform media management operations on the memory device 116). In some embodiments, a memory device 116 is a managed memory device, which is a raw memory device combined with a local controller (e.g., local controller 118) for media management within the same memory device package. An example of a managed memory device is a managed NAND device.

The memory sub-system controller 106 can also include trim circuitry 112. The trim circuitry 112 can comprise an ASIC configured to perform the examples described herein. In some embodiments, a local media controller 118 of a non-volatile memory device 116 includes at least a portion of the trim circuitry 112. For example, the local media controller 118 can include a processor (e.g., processing device) configured to execute instructions stored on the memory device 114 for performing the operations described herein with respect to the trim circuitry 112. In some embodiments, the trim circuitry 112 is part of the host system 102, an application, or an operating system.

Trims are sets of operating parameters, such as voltages, which can be used to operate memory cells. The trim circuitry 112 can issue or cause to be issued a set trim command, which causes the non-volatile memory device 116 (or portions thereof, such as logical units) to use a particular set of operating parameters to operate the memory cells of the non-volatile memory device 116. Trims can include operating parameters associated with various operations such as program (write), program verify, erase, erase verify, and sense (read), among other operations associated with an array of memory cells.

Trims can be used to achieve or adjust desired target voltages for programming memory cells, which can create different threshold voltage (Vt) distributions for data states. Trims can be used to achieve or adjust the valley width between data states (e.g., the voltage spread between different Vt distributions for different data states for memory cells of the non-volatile memory device 116). Different trims can be used for different operations such as programming, reading, and erasing.

Examples of trims include programming voltages, programming frequency, a program start voltage, a program step voltage, a program inhibit start voltage, and an erase verify voltage. The program start voltage is the magnitude of an initial programming voltage pulse of a series of voltage pulses applied to a selected word line during a programming operation performed on memory cells in a selected block. The program step voltage is the voltage step size between programming voltage pulses. The program inhibit start voltage is a voltage used to inhibit further programming of memory cells once the Vt level associated with a desired data state has been reached.

Other examples of trims include read reference voltages and/or program verify voltages. Program verify voltages represent target voltage levels to which memory cells are to be programmed in order to represent a particular data state. Read reference voltages are voltage levels that can be located between program Vt distributions and used to determine a particular data state of a data cell during a data read operation. As used herein, trims are distinguished from programming times. The following description of some example functionality of the trim circuitry 112 is illustrated with respect to FIG. 4.

The trim circuitry 112 can be configured to adjust a trim defining a program verify voltage corresponding to a data state at a first frequency relative to a quantity of PEC during an early portion of a life of the non-volatile memory device 116. The trim circuitry 112 can be configured to adjust the trim defining the program verify voltage corresponding to the data state at a second frequency, less than the first frequency, relative to the quantity of PEC during a middle portion of the life of the non-volatile memory device 116. The trim circuitry 112 can be configured to adjust the trim defining the program verify voltage corresponding to the data state at a third frequency, less than the second frequency, relative to the quantity of PEC during a late portion of the life of the non-volatile memory device 116. The first, second, and third frequencies can be PEC frequencies as opposed to time frequencies (e.g., the first frequency means that an adjustment is made once every x-number of PEC). In at least one embodiment, the quantity of PEC is a quantity of PEC that the non-volatile memory device 116 has undergone at a given point in time. In at least one embodiment, the quantity of PEC is the quantity of PEC that a block including a memory cell to be programmed has undergone at a time at which it is to be programmed.

The trim circuitry 112 can be configured to adjust the trim defining the program verify voltage by a first magnitude at the first frequency during the early portion of the life of the non-volatile memory device 116. The trim circuitry 112 can be configured to adjust the trim defining the program verify voltage by a second magnitude at the second frequency during the middle portion of the life of the non-volatile memory device 116. The trim circuitry 112 can be configured to adjust the trim defining the program verify voltage by a third magnitude at the third frequency during the late portion of the life of the non-volatile memory device 116. In at least one embodiment, the first magnitude is less than the second magnitude and the second magnitude is less than the third magnitude. Accordingly, as the non-volatile memory device 116 ages (as the PEC of the non-volatile memory device 116 increases) the program verify voltage can be increased by increasingly large magnitudes, but less frequently than in earlier portions of life.

The trim circuitry 112 can be configured to adjust a trim defining an erase verify voltage at the first frequency during the early portion of the life of the non-volatile memory device 116. The trim circuitry 112 can be configured to adjust the trim defining an erase verify voltage at the second frequency during the middle portion of the life of the non-volatile memory device 116. The trim circuitry 112 can be configured to adjust the trim defining an erase verify voltage at the third frequency during the late portion of the life of the non-volatile memory device 116. Accordingly, in some embodiments, the erase verify voltage can be adjusted at the same frequency as that of the program verify voltage.

The trim circuitry 112 can be configured to adjust the trim defining the erase verify voltage by a first magnitude at the first frequency during the early portion of the life of the memory device. The trim circuitry 112 can be configured to adjust the trim defining the erase verify voltage by a second magnitude at the second frequency during the middle portion of the life of the memory device. The trim circuitry 112 can be configured to adjust the trim defining the erase verify voltage by a third magnitude at the third frequency during the late portion of the life of the memory device. In at least one embodiment, the first magnitude is less than the second magnitude, which is less than the third magnitude. In at least one embodiment, the program verify voltage can be adjusted by increasing its magnitude and the erase verify voltage can be adjusted by increasing its magnitude, but by a lesser amount than that of the program verify voltage. Accordingly, the valley width between data states (e.g., the programmed state and the erased state for an SLC) can be widened. Although some examples herein describe an early, middle, and late portion of the life of the non-volatile memory device 116, embodiments are not limited to defining only three portions of life, as different quantities of portions can be defined.

The memory sub-system 104 can also include additional circuitry or components that are not illustrated. In some embodiments, the memory sub-system 104 can include a cache or buffer (e.g., DRAM) and address circuitry (e.g., a row decoder and a column decoder) that can receive an address from the memory sub-system controller 114 and decode the address to access the volatile memory device 114 and/or the non-volatile memory device 116.

Figure 2A:
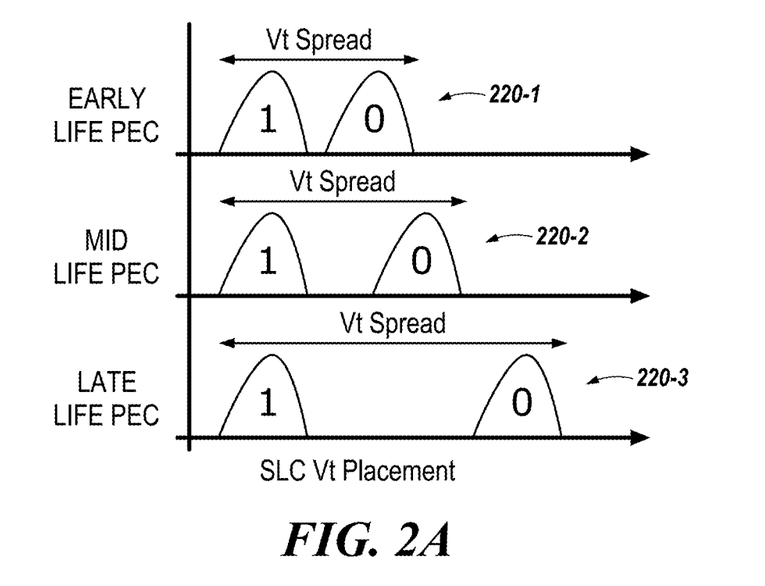
FIG. 2A illustrates different read windows in accordance with some embodiments of the present disclosure.

FIG. 2A illustrates different read windows 220-1, 220-2, 220-3 in accordance with some embodiments of the present disclosure. The horizontal axis represents the charge or voltage of the memory cell ($V_t$) and the vertical axis represents the quantity of memory cells for each data state (1 and 0) that are programmed to a particular voltage. The curves for each data state (1 and 0) therefore represent statistical distributions of memory cell threshold voltages for each data state. The arrows indicating the "$V_t$ spread" (threshold voltage spread) indicate the separation between the $V_t$ distributions along the horizontal axis (e.g., in volts). The $V_t$ spread is also referred to as a read window or a valley width, which can also be defined as being the magnitude difference between different program verify voltages for different programmed states or between a program verify voltage and an erase verify voltage for different data states.

Memory cells of a non-volatile memory device can be in good condition early in the service life of the non-volatile memory device. Because the memory cells are in good condition, large valley margins are not required. Thus, the non-volatile memory device can utilize a narrow read window, such as the read window 220-1, without negatively affecting the reliability of the non-volatile memory device. Utilizing a narrow $V_t$ spread can slow down degradation of memory cells of the non-volatile memory device, which, in turn, can increase the endurance and data retention performance of the non-volatile memory device.

FIG. 2A provides a graphical representation of programming memory cells of a non-volatile memory device to a $V_t$ based on a quantity of PEC that the non-volatile memory device has undergone. Early in the service life of the non-volatile memory device, memory cells of the non-volatile memory device can be programmed to threshold voltages illustrated by the read window 220-1. The read window 220-1 is narrow such that the $V_t$ distribution associated with a data state (e.g., an erased state (1)) is close to the $V_t$ distribution associated with a different data state (e.g., a programmed state (0)). A narrower $V_t$ spread between data states can reduce the data reliability because it can be more difficult to distinguish between the data states. But because the memory cells are in good condition early in the service life of the non-volatile memory device, data states of the memory cells can still be distinguished between even when the read window 220-1 is used. A benefit of using a narrow read window, such as the read window 220-1, early in the service life of the non-volatile memory device can be reducing memory cell degradation early in the service life of the non-volatile memory device instead of using a wide read window, such as the read window 220-3, throughout the service life of the non-volatile memory device. Programming a memory cell to a greater $V_t$ (and subsequently erasing the memory cell) over many cycles can degrade the memory cell at a faster rate than programming the memory to a lower $V_t$ (and subsequently erasing the memory) early in the service life of the non-volatile memory device and increasing the $V_t$ throughout the service life of the non-volatile memory device in accordance with some embodiments of the present disclosure. Although the $V_t$ distribution associated with the erased state "1" in FIG. 2A is illustrated as being static, embodiments are not so limited. In some embodiments, the magnitude of the $V_t$ distribution for the erased state can increase with PEC as well as that of the $V_t$ distribution for the programmed state "0", albeit at a slower rate, as illustrated with respect to FIG. 4. Furthermore, although operation of an SLC is generally illustrated in FIG. 2A, embodiments are not so limited. The same principles can be applied to memory cells that are operated with more than one programmed state.

As illustrated by FIG. 2A, some embodiments of the present disclosure include increasing the $V_t$ corresponding to the second data state as the non-volatile memory device undergoes more PEC. Programming the memory cells to a greater $V_t$ requires a greater voltage and/or increased number of voltage pulses to be applied to the memory cells, which can degrade the materials of the memory cells. During the middle of the service life of the non-volatile memory device, memory cells of the non-volatile memory device can be programmed to a greater $V_t$ corresponding to a desired data state. In response to the non-volatile memory undergoing further PEC, memory cells of the non-volatile memory device can be programmed to a greater $V_t$ corresponding to the data state 0 as illustrated by the read window 220-2. During the latter portion of the service life of the non-volatile memory device, memory cells of the non-volatile memory device can be programmed to an even greater $V_t$ corresponding to a desired data state. In response to the non-volatile memory undergoing even further PEC, memory cells of the non-volatile memory device can be programmed to an even greater $V_t$ corresponding to the data state 0 as illustrated by the read window 220-3. Increasing the read window based on the quantity of PEC that the memory device, block, or cell has undergone (for example, from the read window 220-1 to the read window 220-2 and/or the read window 20-3) in accordance with some embodiments of the present disclosure can be beneficial to improve reliability and/or endurance of the memory device.

Figure 2B:
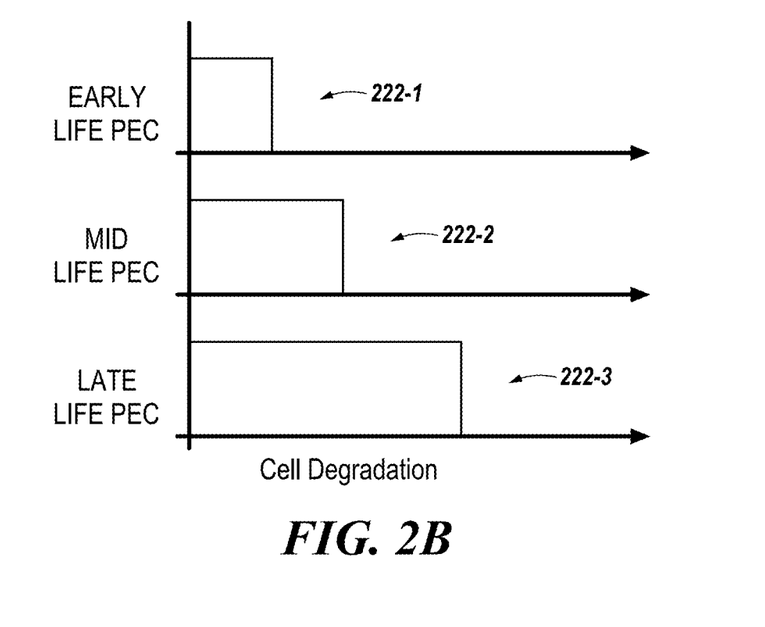
FIG. 2B illustrates graphical representations of degradation of memory cells in accordance with some embodiments of the present disclosure.

FIG. 2B illustrates graphical representations 222-1, 222-2, 222-3 of degradation of memory cells in accordance with some embodiments of the present disclosure. The graphical representations 222 are correlated to the read windows 220 illustrated by FIG. 2A based on PEC. Operating (e.g., programming and erasing) the memory cells of a non-volatile memory device can cause some memory cell degradation. How much a memory cell degrades can be a function of the quantity of PEC undergone by the memory cell (also referred to as the PEC count). As illustrated by FIG. 2B, as a memory cell undergoes an increasing quantity of PEC, degradation of the memory cell increases as illustrated by the transition from the graphical representation 222-1 to the graphical representation 222-2 and to the graphical representation 222-3.

Figure 3:
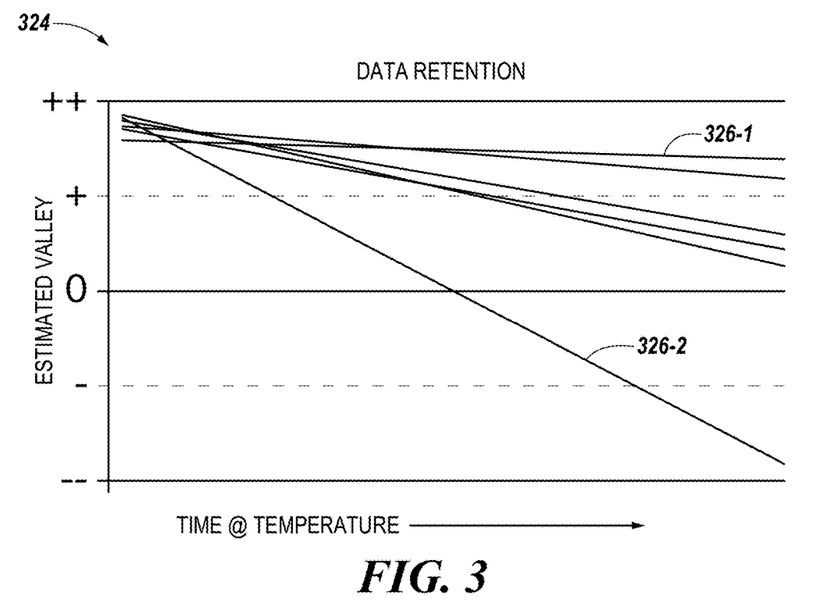
FIG. 3 is a plot indicating data retention in accordance with some embodiments of the present disclosure.

FIG. 3 is a plot 324 indicating data retention in accordance with some embodiments of the present disclosure. The vertical axis of the plot 324 indicates a width of the valley between $V_t$ distributions for an SLC. The width of the valley is also referred to as the read window. The quality of the valley is indicated as neutral by "0" and increasing as indicated by "+", "++", and decreasing as indicated by "−", "−−". The quality of the valley indicated by the plus signs indicates that data is recoverable. The quality of the valley indicated by minus signs indicates that data is not recoverable. The horizontal axis of the plot 324 indicates retention time as the passage of time at a test temperature with time increasing toward the right side of the plot 324.

Each of the lines on the plot 324 represents the data retention capability of an SLC as indicated by the estimated valley during the service life of the SLC for a respective quantity of PEC that the SLC has undergone. For example, line 326-1 represents the data retention capability of an SLC that has undergone a first quantity of PEC during the service life of the SLC and line 326-2 represents the data retention capability of an SLC that has undergone a second, greater quantity of PEC during the service life of the SLC. The quantity of PEC that the SLC has undergone increases in the downward direction on the plot 324. As illustrated by the plot 324, the data retention capability of the SLC decreases significantly as the PEC increase.

Figure 4:
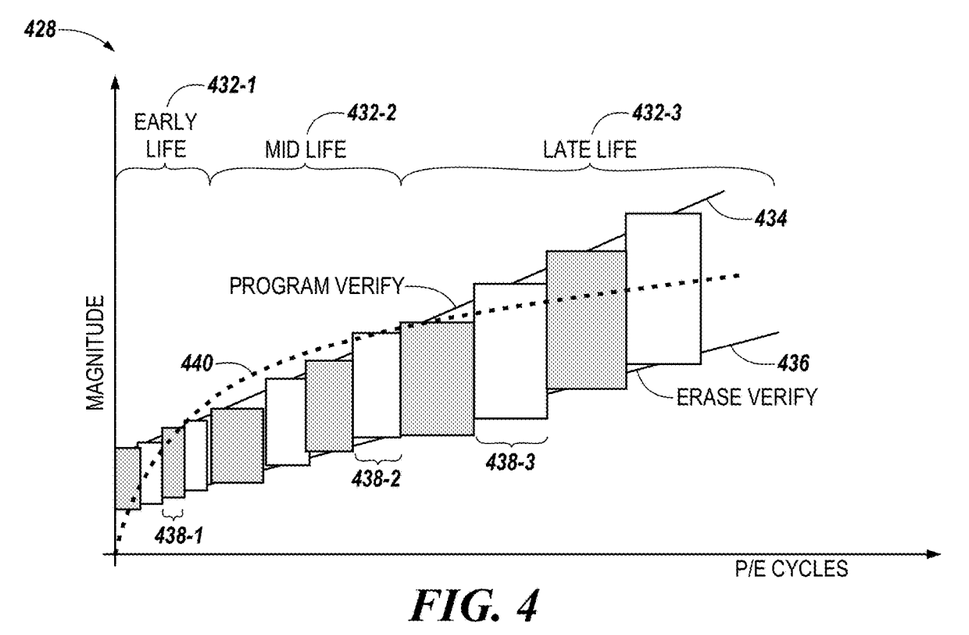
FIG. 4 is a plot of magnitude versus program/erase cycles indicating various adjustments to trims and intervals in accordance with some embodiments of the present disclosure.

FIG. 4 is a plot 428 of magnitude versus PEC indicating various adjustments to trims and intervals in accordance with some embodiments of the present disclosure. The plot 428 generally indicates a valley width between data states comprising a programmed state and an erased state by indicating the magnitude of the program verify voltage 434 and erase verify voltage 436. The valley width, the program verify voltage 434, and/or the erase verify voltage 436 can be trims that can be adjusted, for example, with a set trim command. The lines indicating the magnitudes of the program verify voltage 434 and the erase verify voltage 436 represent averages of those trims, the exact values of which are represented by the tops and bottoms of the PEC intervals, as described in more detail below. As illustrated, the valley width increases with increased PEC. As is also illustrated, the magnitude of both the program verify voltage 434 and the erase verify voltage 436 increase with increased PEC, but the program verify voltage 434 can increase at a faster rate than the erase verify voltage 436, which causes the valley width between the programmed state and the erased state to increase with increased PEC. These increases are controlled by adjusting trims.

PEC intervals are indicated by the width 438 of the alternating shaded and empty blocks that generally follow the valley width between the program verify voltage 434 and the erase verify voltage 436. The PEC intervals are illustrated as alternating shaded and empty blocks merely to aid in viewing the adjacent blocks. In any given PEC interval, the valley width can provide a margin for error for reading memory cells and that margin can be dictated by the reliability requirement of the maximum PEC in that interval (e.g., the worst case scenario for that interval). The dotted line 440 represents the return on investment of a static or fixed valley width increment normalized to the operating valley width. As indicated by the dotted line 440, that return on investment increases rapidly in the early life 432-1 of the memory device, but then increases less rapidly during the middle life 432-2, and increases less rapidly still during the late life 432-3. The portions of life 432 of the memory device are based on PEC count and, as illustrated, do not change linearly with PEC count. The portion of the life of the memory device that is considered early life 432-1 is shorter than the portion considered to be middle life 432-2, which is shorter than the portion considered to be late life 432-3.

A smaller PEC interval is illustrated during early life 432-1 by the narrower width 438-1 of the blocks (covering fewer PEC along the horizontal axis) compared to the intermediate width 438-2 of the blocks during the middle life 432-2 and the wider width 438-3 of the blocks during late life 432-3. The width 438 of the PEC intervals indicates the quantity of PEC in that interval. Therefore, a narrower width 438 indicates fewer PEC in that interval. The smaller PEC interval during early life 432-1 enables budgeting a smaller valley width resulting in a better return on investment. Smaller valley width increments across PEC intervals for an already larger valley width would have lesser return on investment. Using a smaller PEC interval during middle life 432-2 and late life 432-3 of the memory device would have a lesser return on investment because, for example, the late life 432-3 is operated with a larger valley width (read window budget) due to reliability requirements. The portions of life 432 correspond to groups of PEC intervals. The width 438-1 of each of the PEC intervals in the early life 432-1 is the same. The width 438-2 of each of the PEC intervals in the middle life 432-2 is the same. The width 438-3 of each of the PEC intervals in the late life 432-3 is the same.

Although three PEC groups are illustrated, embodiments are not limited to a particular number of PEC groups. Using a relatively large number of PEC groups in a system results in relatively more firmware overhead for calibrating the various trims such as read voltages of the PEC groups. At least one embodiment of the present disclosure adjusts the trim comprising the valley width at finer intervals during the early life 432-1 of the memory device when the operating valley width is narrower and as the PEC accumulate, the valley width is increased at coarser intervals, when using smaller intervals has diminishing returns.

Although not specifically labeled, each PEC interval is also accompanied by an increase in the magnitude, which is indicated by each successive PEC block having a top surface at a greater magnitude and a bottom surface at a greater magnitude (e.g., the blocks appear to move up from left to right across the plot 428). The top and bottom of each PEC interval represent the respective program verify voltage 434 and erase verify voltage 436 therefor. These increases in magnitude are sometimes referred to herein as increases by a step. During the early life 432-1 of the memory device, the magnitudes can be increased by a first step (as indicated by each successive block moving up by a same amount during the early life 432-1). During the middle life 432-2 of the memory device, the magnitudes can be increased by a second step, greater than the first step (as indicated by each successive block moving up by a same amount during the middle life 432-2 that is greater than the increase during the early life 432-1). During the late life 432-3 of the memory device, the magnitudes can be increased by a third step, greater than the second step (as indicated by each successive block moving up by a same amount during the late life 432-3 that is greater than the increase during the middle life 432-2).

Increasing the valley width uniformly at linear intervals of PEC over the life of the memory device is overkill. The memory cell degradation return on investment is dependent on the ratio of the valley width increment and operating valley width. Larger valley width increments on top of smaller operating valley width during early life 432-1 can result in unnecessary memory cell degradation. Smaller valley width increments on top of larger operating valley width during late life 432-3 can have minimal memory cell degradation return on investment.

Figure 5:
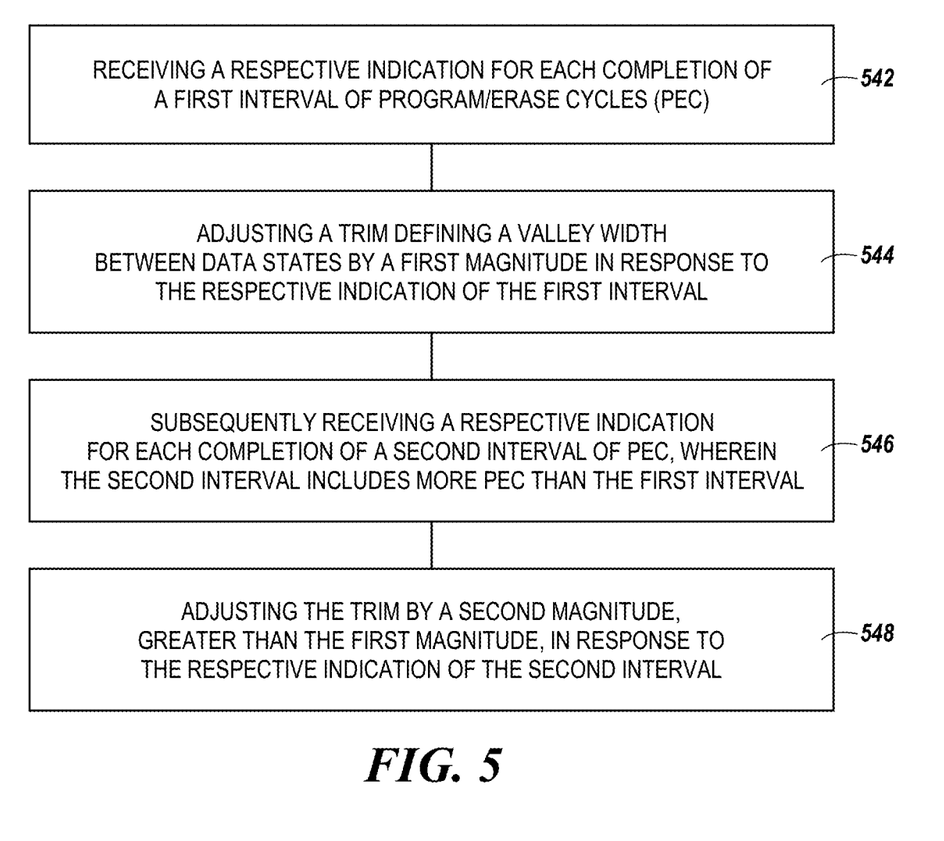
FIG. 5 is a flow diagram of an example method for trims corresponding to program/erase cycles in accordance with some embodiments of the present disclosure.

FIG. 5 is a flow diagram of an example method for trims corresponding to program/erase cycles in accordance with some embodiments of the present disclosure. The method can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method is performed by or using the memory sub-system controller 106, processing device 108, trim circuitry 112, non-volatile memory device 116 and/or volatile memory device 114, and/or local media controller 118 shown in FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 542 in the example method of FIG. 5, a respective indication can be received for each completion of a first interval of PEC. The first interval can be a particular quantity of PEC either for a block of memory cells or for the memory device as a whole. For example, the first interval could be 500 PEC, where an indication is received for every 500 PEC (e.g., at 500 PEC, at 1000 PEC, at 1500 PEC, and so on). At block 544 in the example method of FIG. 5, a trim defining a valley width between data states can be adjusted by a first magnitude in response to the respective indication of the first interval. For example, the first magnitude can 50 millivolts (mV). Continuing the example, an indication can be received for every 500 PEC and in response to each indication, the trim can be adjusted such that the valley width increases by 50 mV. The valley width can be a range (e.g. in mV) between adjacent programmed states or between a programmed state and an erased state. The valley width can be defined, for example, by a voltage range between program verify voltages for adjacent programmed states or between a program verify voltage and an erase verify voltage for a programmed state and the erased state respectively.

At block 546 in the example method of FIG. 5, subsequent to receiving the indications for completion of the first intervals, a respective indication can be received for each completion of a second interval of PEC. The second interval includes more PEC than the first interval. For example, if the first interval is 500 PEC, the second interval can be 1000 PEC, however embodiments are not limited to these specific examples. The indications of the first intervals are received during a first (early) portion of the life of the memory device as measured by PEC. For example, the early portion of the life of the memory device can end at 10,000 PEC. In this example, the first indications would be received every 500 PEC up to 10,000 PEC. Subsequently, second indications would be received at every 1000 PEC after 10,000 PEC. Embodiments are not limited to these specific examples. At block 548 in the example method of FIG. 5, the trim can be adjusted by a second magnitude in response to the respective indication of the second interval. The second magnitude is greater than the first magnitude. For example, if the first magnitude is 50 mV, the second magnitude can be 100 mV.

Although not specifically illustrated, the method can include, subsequent to receiving the indications for completion of the first and second intervals, receiving a respective indication for each completion of a third interval of PEC. The third interval includes more PEC than the second interval. For example, if the second interval includes 1000 PEC, the third interval can include 2000 PEC. The indications of the second intervals are received during a second (middle) portion of the life of the memory device as measured by PEC. For example, the middle portion of the life of the memory device can end at 40,000 PEC. In this example, the second indications would be received every 1000 PEC up to 40,000 PEC. Subsequently, second indications would be received at every 2000 PEC after 40,000 PEC. The trim can be adjusted by a third magnitude, greater than the second magnitude, in response to the respective indication of the third interval. For example, if the second magnitude is 100 mV, the third magnitude can be 250 mV. Embodiments are not limited to having only two or three different intervals and trim adjustments for the memory device.

Although not specifically illustrated, the method can further include programming a first memory cell using the trim adjusted by the first magnitude prior to receiving any indication of completion of the second interval of PEC. The trim (as adjusted by the first magnitude based on the quantity of PEC intervals that have occurred) is used for programming memory cells of the memory device for a first portion of the life of the memory device (as defined by PEC). The method can further include programming a second memory cell using the trim adjusted by the second magnitude after receiving any indication of completion of the second interval of PEC. The trim (as adjusted by the second magnitude based on the quantity of PEC intervals that have occurred) is used for programming memory cells of the memory device for a second portion of the life of the memory device. Memory cells of the memory device can be programmed using the trim as adjusted by a third magnitude based on the quantity of PEC intervals that have occurred for a third portion of the life of the memory device.

Figure 6:
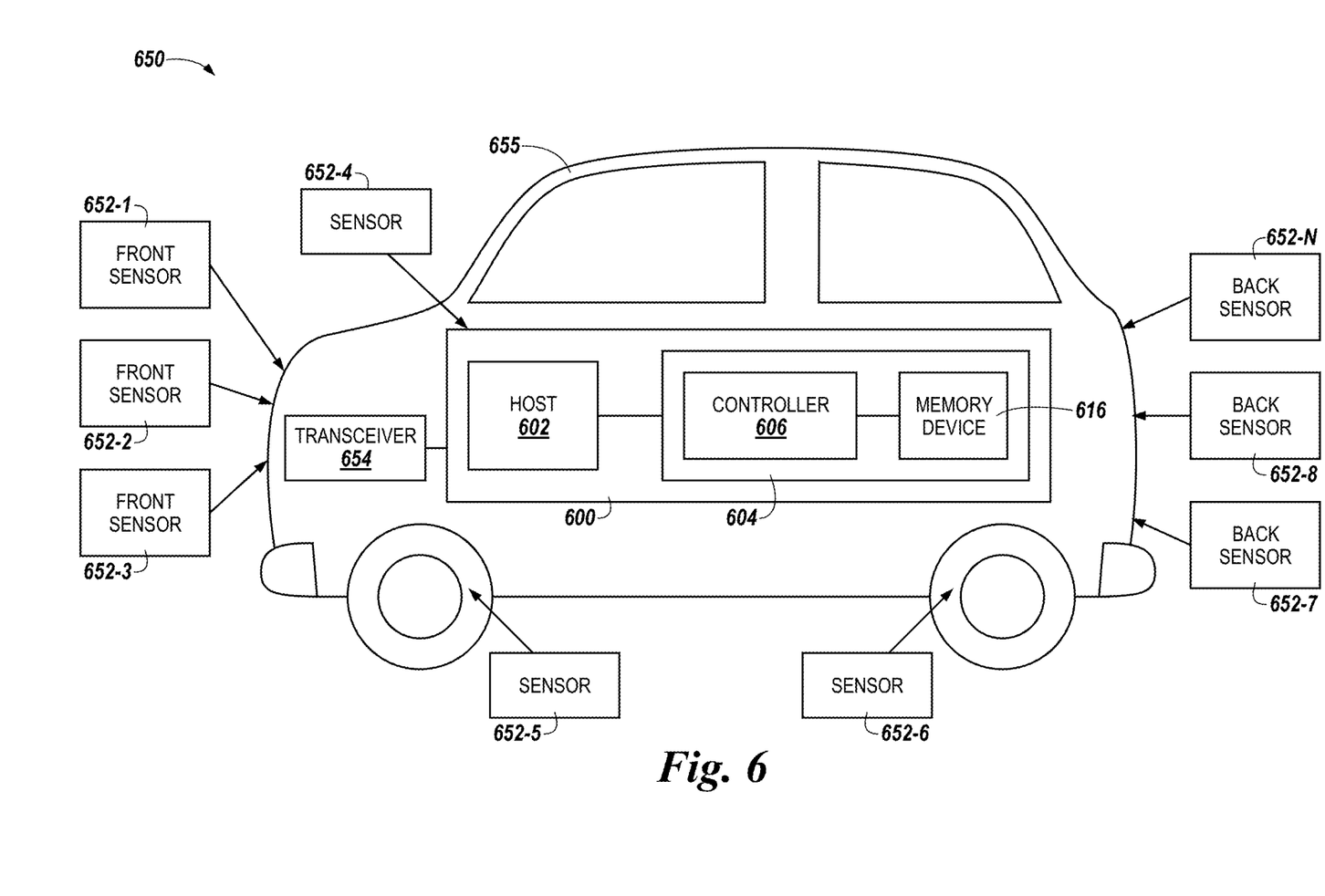
FIG. 6 illustrates an example of a system including a computing system in a vehicle in accordance with some embodiments of the present disclosure.

FIG. 6 illustrates an example of a system 650 including a computing system 600 in a vehicle 655 in accordance with some embodiments of the present disclosure. The computing system 600 can include a memory sub-system 604, which is illustrated as including a controller 606 and non-volatile memory device 616 for simplicity but is analogous to the memory sub-system 104 illustrated in FIG. 1. The computing system 600, and thus the host 602, can be coupled to a number of sensors 652 either directly, as illustrated for the sensor 652-4 or via a transceiver 652 as illustrated for the sensors 652-1, 652-2, 652-3, 652-5, 652-6, 652-5, 652-8, ..., 652-N. The transceiver 652 is able to receive time based telemetric sensor data from the sensors 652 wirelessly, such as by radio frequency communication. In at least one embodiment, each of the sensors 652 can communicate with the computing system 600 wirelessly via the transceiver 652. In at least one embodiment, each of the sensors 652 is connected directly to the computing system 600 (e.g., via wires or optical cables). As used herein, telemetric sensor data means that the data is collected by sensors 652 that are remote from the memory sub-system 604 that stores the data (the receiving equipment). The telemetric sensor data is time based because the data is correlated with time. The time corresponding to each data point can either be stored with the telemetric data or derivable therefrom based on some metric, such as a known start time for the data and a data rate. The time can be useful in the playback of the sequences preceding an accident, for example.

The vehicle 655 can be a car (e.g., sedan, van, truck, etc.), a connected vehicle (e.g., a vehicle that has a computing capability to communicate with an external server), an autonomous vehicle (e.g., a vehicle with self-automation capabilities such as self-driving), a drone, a plane, a ship, and/or anything used for transporting people and/or goods. The sensors 652 are illustrated in FIG. 6 as including example attributes. For example, sensors 652-1, 652-2, and 652-3 are camera sensors collecting data from the front of the vehicle 655. Sensors 652-4, 652-5, and 652-6 are microphone sensors collecting data from the from the front, middle, and back of the vehicle 655. The sensors 652-7, 652-8, and 652-N are camera sensors collecting data from the back of the vehicle 655. As another example, the sensors 652-5, 652-6 are tire pressure sensors. As another example, the sensor 652-4 is a navigation sensor, such as a global positioning system (GPS) receiver. As another example, the sensor 652-6 is a speedometer. As another example, the sensor 652-4 represents a number of engine sensors such as a temperature sensor, a pressure sensor, a voltmeter, an ammeter, a tachometer, a fuel gauge, etc. As another example, the sensor 652-4 represents a video camera.

The host 602 can execute instructions to provide an overall control system and/or operating system for the vehicle 655. The host 602 can be a controller designed to assist in automation endeavors of the vehicle 655. For example, the host 602 can be an advanced driver assistance system controller (ADAS). An ADAS can monitor data to prevent accidents and provide warning of potentially unsafe situations. For example, the ADAS can monitor sensors in the vehicle 655 and take control of vehicle 655 operations to avoid accident or injury (e.g., to avoid accidents in the case of an incapacitated user of a vehicle). The host 602 may need to act and make decisions quickly to avoid accidents. The memory sub-system 604 can store reference data in the non-volatile memory device 616 such that time based telemetric sensor data from the sensors 652 can be compared to the reference data by the host 602 in order to make quick decisions.

Figure 7:
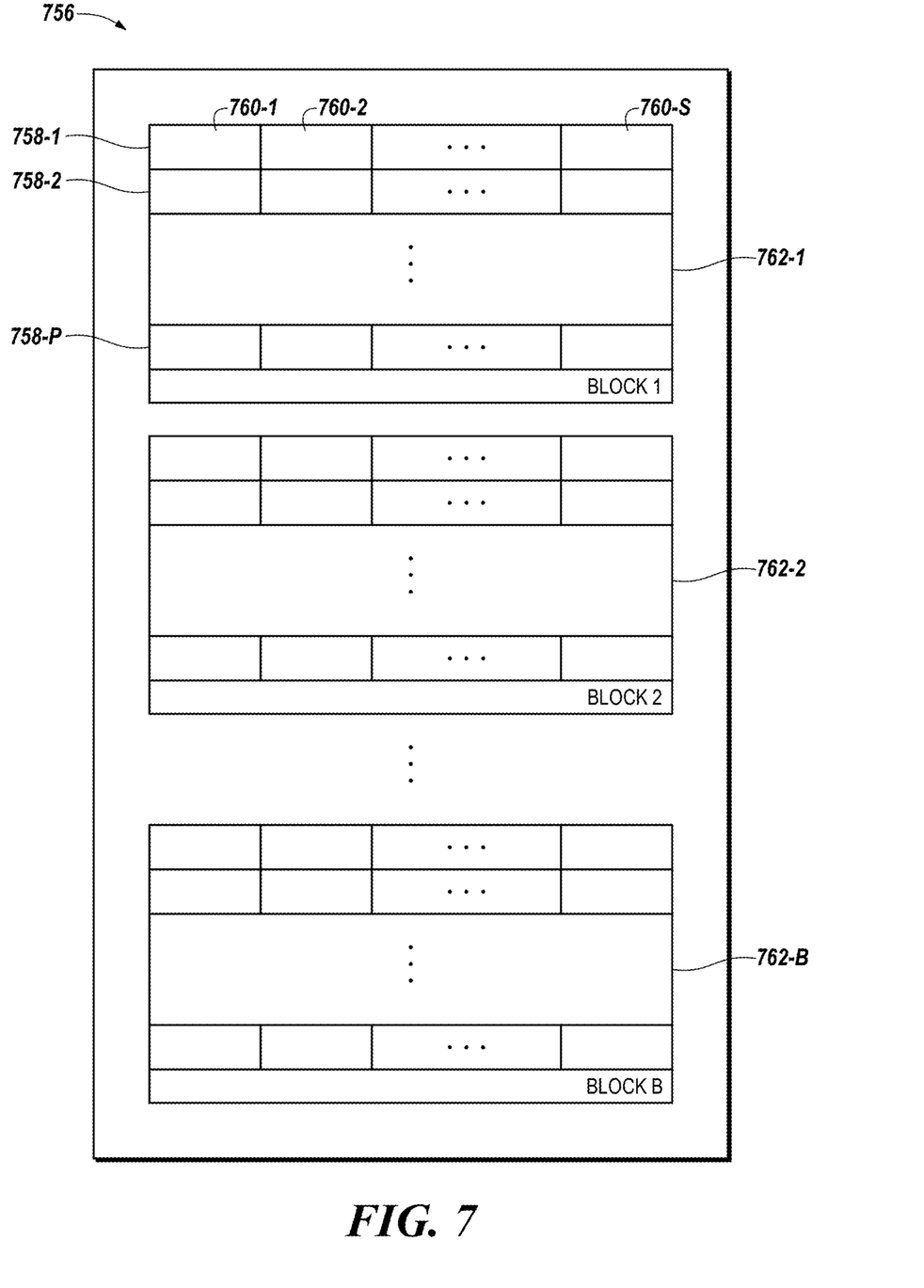
FIG. 7 illustrates a diagram of a portion of a memory array having physical blocks in accordance with some embodiments of the present disclosure.

FIG. 7 illustrates a diagram of a portion of a memory array having physical blocks in accordance with some embodiments of the present disclosure. The memory array 756 can represent a memory array of the non-volatile memory device 116 in FIG. 1, for example. The memory array 756 can be, for example, a NAND flash memory array. As an additional example, memory array 756 can be an SCM array, such as, for instance, a three-dimensional cross-point (3D XPoint) memory array, a ferroelectric RAM (FRAM) array, or a resistance variable memory array such as a PCRAM, RRAM, or spin torque transfer (STT) array, among others. Further, although not shown in FIG. 7, memory array 756 can be located on a particular semiconductor die along with various peripheral circuitry associated with the operation thereof.

As shown in FIG. 7, the memory array 756 has a number of physical blocks 762-1 (BLOCK 1), 762-2 (BLOCK 2), ..., 762-B (BLOCK B) of memory cells. The memory cells can be operated with various programming times and trims. A number of physical blocks 762 of memory cells can be included in a plane of memory cells, and a number of planes of memory cells can be included on a die. For instance, in the example shown in FIG. 7, each physical block 762 can be part of a single die. The portion of the memory array 756 illustrated in FIG. 7 can be a die of memory cells and/or a logical unit.

As shown in FIG. 7, each physical block 762 includes a number of physical rows (e.g., rows 758-1, 758-2, ..., 758-R) of memory cells coupled to access lines (e.g., word lines). Further, although not shown in FIG. 7, the memory cells can be coupled to sense lines (e.g., data lines and/or digit lines). As one of ordinary skill in the art will appreciate, each row 758 can include a number of pages of memory cells (e.g., physical pages). A physical page refers to a unit of programming and/or sensing (e.g., a number of memory cells that are programmed and/or sensed together as a functional group). In the embodiment shown in FIG. 7, each row 758 comprises one physical page of memory cells. However, embodiments of the present disclosure are not so limited. For instance, in an embodiment, each row can comprise multiple physical pages of memory cells (e.g., one or more even pages of memory cells coupled to even-numbered bit lines, and one or more odd pages of memory cells coupled to odd numbered bit lines). Additionally, for embodiments including multilevel cells, a physical page of memory cells can store multiple logical pages of data (e.g., an upper page of data and a lower page of data, with each cell in a physical page storing one or more bits towards an upper page of data and one or more bits towards a lower page of data).

As shown in FIG. 7, a row 758 of memory cells can comprise a number of physical sectors 760-1, 760-2, ..., 760-S (e.g., subsets of memory cells). Each physical sector 760 of cells can store a number of logical sectors of data. Additionally, each logical sector of data can correspond to a portion of a particular page of data. As an example, one logical sector of data stored in a particular physical sector can correspond to a logical sector corresponding to one page of data, and the other logical sector of data stored in the particular physical sector can correspond to the other page of data. Each physical sector 760, can store system data, user data, and/or overhead data, such as error correction code (ECC) data, LBA data, and metadata.

Figure 8:
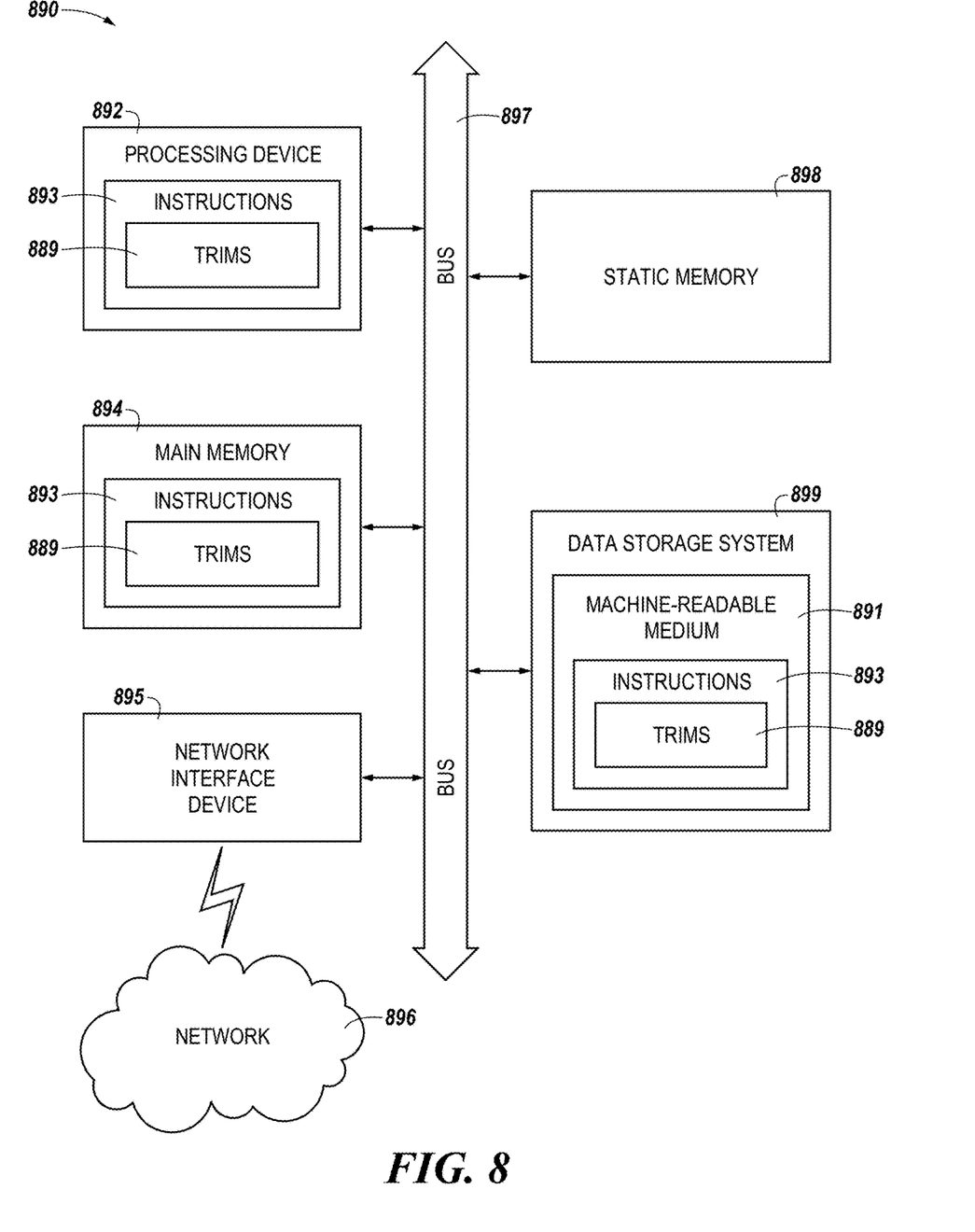
FIG. 8 is a block diagram of an example computer system in which embodiments of the present disclosure can operate.

FIG. 8 is a block diagram of an example computer system in which embodiments of the present disclosure can operate. Within the computer system 890, a set of instructions, for causing a machine to perform one or more of the methodologies discussed herein, can be executed. The computer system 890 includes a processing device 892, a main memory 894, a static memory 898 (e.g., flash memory, static random access memory (SRAM), etc.), and a data storage system 899, which communicate with each other via a bus 897. The data storage system 899 is analogous to the memory sub-system 104 illustrated in FIG. 1.

The processing device 892 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 892 can also be one or more special-purpose processing devices such as an ASIC, an FPGA, a digital signal processor (DSP), network processor, or the like. The processing device 892 is configured to execute instructions 893 for performing the operations and steps discussed herein. The computer system 890 can further include a network interface device 895 to communicate over a network 896.

The data storage system 899 can include a machine-readable storage medium 891 (also known as a computer-readable medium) on which is stored one or more sets of instructions 893 or software embodying one or more of the methodologies or functions described herein. The instructions 893 can also reside, completely or at least partially, within the main memory 894 and/or within the processing device 892 during execution thereof by the computer system 890, the main memory 894 and the processing device 892 also constituting machine-readable storage media.

In one embodiment, the instructions 893 can be executed to implement functionality corresponding to the trim circuitry 112 of FIG. 1. The instructions 893 can be executed to adjust a trim 889 at first intervals until a quantity of PEC have occurred. The trim 889 can define a valley width between data states. The instructions 893 to adjust the trim 889 can define a program verify voltage for programming memory cells to a programmed state. The instructions 893 to adjust the trim 889 can define an erase verify voltage for erasing memory cells. The instructions 893 can be executed to adjust the trim 889 at second intervals, greater than the first intervals, after the quantity of PEC have occurred. The first intervals can be a first quantity of PEC and the second intervals can be a second quantity of PEC. The instructions 893 can be executed to adjust the trim 889 by a first step at the first interval and to adjust the trim 889 by a second step, larger than the first step, at the second interval. The first step can be an increase in a difference between the program verify voltage and the erase verify voltage of a first magnitude. The second step can be an increase in the difference between the program verify voltage and the erase verify voltage of a second magnitude, greater than the first magnitude.

The instructions 893 can be executed to adjust the trim 889 at the first intervals until a first quantity of PEC have occurred, adjust the trim 889 at second intervals until a second quantity of PEC have occurred, and adjust the trim 889 at third intervals, greater than the second intervals, after the second quantity of PEC have occurred. The instructions 893 can be executed to wear level blocks of memory according to a first wear leveling algorithm until a third quantity of PEC have occurred. The third quantity of PEC is greater than the first quantity of PEC and less than the second quantity of PEC. The instructions 893 can be executed to wear level the blocks of memory according to a second wear leveling algorithm until a fourth quantity of PEC have occurred. The fourth quantity of PEC is greater than the second quantity of PEC.

While the machine-readable storage medium 891 is shown in an example embodiment to be a single medium, the term "machine-readable storage medium" should be taken to include a single medium or multiple media that store the one or more sets of instructions. The term "machine-readable storage medium" shall also be taken to include a medium that is capable of storing or encoding a set of instructions for execution by the machine and that cause the machine to perform one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, types of disk including floppy disks, optical disks, CD-ROMs, and magnetic-optical disks, ROMs, RAMs, EPROMs, EEPROMs, magnetic or optical cards, or type of media suitable for storing electronic instructions, each coupled to a computer system bus.

The algorithms and displays presented herein are not inherently related to a particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to a particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes a mechanism for storing information in a form readable by a machine (e.g., a computer). In some embodiments, a machine-readable (e.g., computer-readable) medium includes a machine (e.g., a computer) readable storage medium such as a ROM, RAM, magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A non-transitory computer-readable storage medium comprising instructions that, when executed by a processing device, cause the processing device to:
   adjust a trim at first intervals until a quantity of program/erase cycles (PEC) have occurred, wherein the trim defines a valley width between data states; and
   adjust the trim at second intervals, greater than the first intervals, after the quantity of PEC have occurred.

2. The medium of claim 1, wherein each of the first intervals comprises a first quantity of PEC; and
   wherein each of the second intervals comprises a second quantity of PEC greater than the first quantity of PEC.

3. The medium of claim 1, further comprising instructions to:
   adjust the trim by a first step at the first intervals; and
   adjust the trim by a second step, larger than the first step, at the second intervals.

4. The medium of claim 3, wherein the instructions to adjust the trim comprise instructions to define a program verify voltage and an erase verify voltage;
   wherein the first step comprises an increase in a difference between the program verify voltage and the erase verify voltage of a first magnitude; and
   wherein the second step comprises an increase in the difference between the program verify voltage and the erase verify voltage of a second magnitude, greater than the first magnitude.

5. The medium of claim 1, wherein the instructions to adjust the trim comprise instructions to define a program verify voltage for programming memory cells to a programmed state.

6. The medium of claim 5, wherein the instructions to adjust the trim further comprise instructions to define an erase verify voltage for erasing memory cells.

7. The medium of claim 1, wherein the quantity of PEC comprises a first quantity of PEC; and
   further comprising instructions to:
      adjust the trim at second intervals until a second quantity of PEC have occurred; and
      adjust the trim at third intervals, greater than the second intervals, after the second quantity of PEC have occurred.

8. The medium of claim 7, further comprising instructions to:
   wear level blocks of memory according to a first wear leveling algorithm until a third quantity of PEC have occurred;
   wherein the third quantity of PEC is greater than the first quantity of PEC and less than the second quantity of PEC;
   wear level the blocks of memory according to a second wear leveling algorithm until a fourth quantity of PEC have occurred;
   wherein the fourth quantity of PEC is greater than the second quantity of PEC.

9. A system comprising:
   a memory device; and
   a processing device coupled to the memory device, wherein the processing device is to:
      adjust a trim defining a program verify voltage corresponding to a data state at a first frequency relative to a quantity of program/erase cycles (PEC) during an early portion of a life of a memory device;
      adjust the trim defining the program verify voltage corresponding to the data state at a second frequency, less than the first frequency, relative to the quantity of PEC during a middle portion of the life of the memory device; and
      adjust the trim defining the program verify voltage corresponding to the data state at a third frequency, less than the second frequency, relative to the quantity of PEC during a late portion of the life of the memory device.

10. The system of claim 9, wherein the first frequency, the second frequency, and the third frequency comprise PEC frequencies.

11. The system of claim 10, wherein the quantity of PEC is the quantity of PEC that the memory device has undergone at a given point in time.

12. The system of claim 10, wherein the quantity of PEC is the quantity of PEC that a block including a memory cell to be programmed has undergone at a time at which it is to be programmed.

13. The system of claim 9, wherein the processing device is further to:
   adjust the trim defining the program verify voltage by a first magnitude at the first frequency during the early portion of the life of the memory device;
   adjust the trim defining the program verify voltage by a second magnitude at the second frequency during the middle portion of the life of the memory device; and
   adjust the trim defining the program verify voltage by a third magnitude at the third frequency during the late portion of the life of the memory device.

14. The system of claim 13, wherein the first magnitude is less than the second magnitude; and
   wherein the second magnitude is less than the third magnitude.

15. The system of claim 9, wherein the processing device is further to:
   adjust a trim defining an erase verify voltage at the first frequency during the early portion of the life of the memory device;
   adjust the trim defining the erase verify voltage at the second frequency during the middle portion of the life of the memory device; and
   adjust the trim defining the erase verify voltage at the third frequency during the late portion of the life of the memory device.

16. The system of claim 15, wherein the processing device is further to:

adjust the trim defining the erase verify voltage by a first magnitude at the first frequency during the early portion of the life of the memory device;
adjust the trim defining the erase verify voltage by a second magnitude at the second frequency during the middle portion of the life of the memory device; and
adjust the trim defining the erase verify voltage by a third magnitude at the third frequency during the late portion of the life of the memory device.

17. The system of claim 16, wherein the first magnitude is less than the second magnitude; and
wherein the second magnitude is less than the third magnitude.

18. A method, comprising:
receiving a respective indication for each of a plurality of completions of a first interval of program/erase cycles (PEC);
adjusting a trim defining a valley width between data states by a first magnitude in response to the respective indication of the first interval;
subsequently receiving a respective indication for each of a plurality of completions of a second interval of PEC;
wherein the second interval includes more PEC than the first interval; and
adjusting the trim by a second magnitude, greater than the first magnitude, in response to the respective indication of the second interval.

19. The method of claim 18, further comprising:
programming a first memory cell using the trim adjusted by the first magnitude prior to receiving any indication of completion of the second interval of PEC; and
programming a second memory cell using the trim adjusted by the second magnitude after receiving any indication of completion of the second interval of PEC.

20. The method of claim 18, further comprising subsequently receiving a respective indication for each of a plurality of completions of a third interval of PEC;
wherein the third interval includes more PEC than the second interval; and
adjusting the trim by a third magnitude, greater than the second magnitude, in response to the respective indication of the third interval.

\* \* \* \* \*